United States Patent

Gen-ei

[11] Patent Number: 5,229,879
[45] Date of Patent: Jul. 20, 1993

[54] SEMICONDUCTOR LASER AMPLIFIER
[75] Inventor: Koichi Gen-ei, Ichikawa, Japan
[73] Assignee: Kabushiki Kaisha Toshiba, Kawasaki, Japan
[21] Appl. No.: 765,900
[22] Filed: Sep. 26, 1991
[30] Foreign Application Priority Data Sep. 28, 1990 [JP] Japan .................. 2-257110

[51] Int. Cl.⁵ .................................. H01S 3/19
[52] U.S. Cl. ............................ 359/344; 372/45
[58] Field of Search .............. 359/344, 343, 342; 372/43, 45, 46; 357/30

[56] References Cited

U.S. PATENT DOCUMENTS

| | | | |
|---|---|---|---|
| 4,152,713 | 5/1979 | Copeland, III et al. | 357/19 |
| 4,910,571 | 3/1990 | Kasahara et al. | 359/344 |
| 5,019,787 | 5/1991 | Carlson et al. | 359/344 |

FOREIGN PATENT DOCUMENTS

| | | |
|---|---|---|
| 0245085 | 11/1987 | European Pat. Off. . |
| 63-316812 | 6/1987 | Japan . |
| 63-502316 | 9/1988 | Japan . |
| 1-293584 | 11/1989 | Japan . |
| 2-234109 | 9/1990 | Japan . |
| 2033648 | 5/1980 | United Kingdom . |

OTHER PUBLICATIONS

Patent Abstracts of Japan—vol. 13, No. 16 (E-703)(3364) Jan. 13, 1989 & JP-A-63221692.
Patent Abstracts of Japan—vol. 6, No. 95 (E-110) Jun. 3, 1982 & JP-A-57028392.
Patent Abstracts of Japan—vol. 12, No. 12 (P-655) Jan. 14, 1988 & JP-A-62170918.
Patent Abstracts of Japan—vol. 9, No. 298 (E-361)(2021) Nov. 26, 1985 & JP-A-60136387.

Primary Examiner—Ian J. Lobo
Attorney, Agent, or Firm—Finnegan, Henderson, Farabow, Garrett & Dunner

[57] ABSTRACT

A semiconductor laser amplifier according to this invention has an optical waveguide layer containing a p-type semiconductor layer in an n-type semiconductor substrate. On one end of the n-type semiconductor substrate, for example, a reflective film is formed as light-reflecting means. In this invention, two optical waveguide layers are arranged so as to form a V with these two layers meeting each other at one end, on which the reflective film is formed, of the substrate.

14 Claims, 7 Drawing Sheets

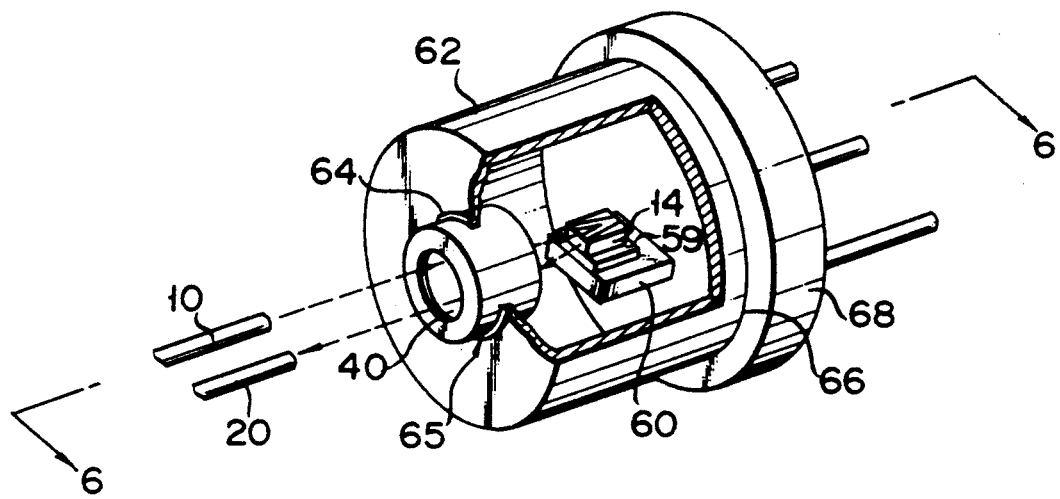
F I G. 6
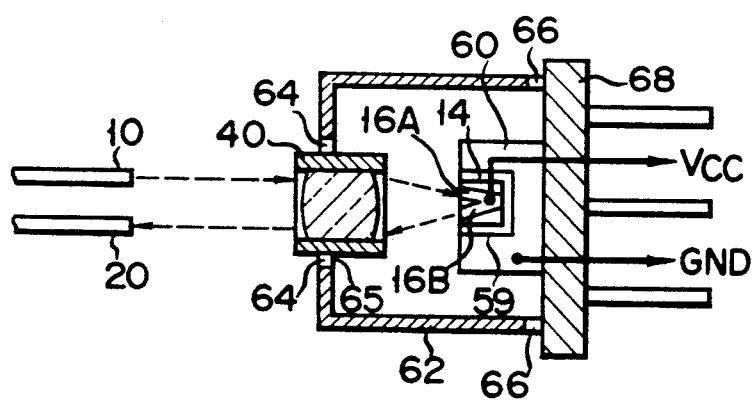
F I G. 7

SEMICONDUCTOR LASER AMPLIFIER

BACKGROUND OF THE INVENTION

1. Field of the Invention

This invention relates to a semiconductor laser amplifier, and more particularly to a semiconductor laser amplifier used in optical communications to amplify optical signals.

2. Description of the Related Art

Since an expensive optical repeater may be replace by only one semiconductor laser amplifier, semiconductor laser amplifiers are expected to significantly reduce the cost of building optical fiber relay networks in the future.

FIG. 1 is a block diagram of a conventional typical semiconductor laser amplifier.

As shown in FIG. 1, the light propagated along the optical fiber 10 is supplied via the image forming lens 12 to the optical waveguide layer 16 of the semiconductor laser amplifier 14. The optical waveguide layer 16 also serves as an optical active layer, in which light is amplified and leaves the amplifier 14. The amplified light from the amplifier 14 is supplied via the image forming lens 18 to the optical fiber 20, returning to the optical fiber relay network.

To achieve a sufficient gain at the amplifier 14, it is necessary to make the length of the optical waveguide layer 16 or a cavity length L sufficiently long. For this reason, semiconductor laser amplifiers must have a laser chip length of approximately 400 to 1000 μm, more than twice an ordinary laser chip length of 200 to 300 μm. This leads to a poorer productivity.

Further, in the optical system, it is necessary to connect lenses or fibers to both ends of a chip of the order of 400 to 1000 μm in length, which makes it difficult not only to design and fabricate amplifiers but also to perform important work, such as hermetic sealing, in terms of reliability.

A semiconductor laser amplifier proposed especially to overcome a poor productivity is shown in FIG. 2.

As shown in FIG. 2, the light propagated along the optical fiber 10 is supplied via the beam splitter 30 to the round-tip optical fiber 32. The light leaving the round-tip optical fiber 32 is supplied to the optical wave guide layer 16 of the semiconductor laser amplifier 14. The light travels along the optical waveguide layer 16 increasing its gain until it reaches the end of the resonator. Formed on the end is a high reflection coating film (HR film) 34, which reflects the light. The reflected light then travels backward along the optical waveguide layer 16 further increasing its gain. The light with the increased gain is supplied again to the round-tip optical fiber 32, then split at the beam splitter 30 to go to the optical fiber 20, and returns to the optical fiber relay network.

By propagating light forward and then backward along the optical waveguide layer 16 of the semiconductor laser amplifier 14, it is possible to achieve nearly twice the length of the optical waveguide layer 16, that is, approximately 2L with respect to the cavity length of L, which provides a small chip with a large gain.

However, because the incoming light and outgoing light are propagated along the same optical waveguide layer, the beam splitter 30 to sort them must be added in the optical fiber. Presently, it is extremely difficult to completely separate the incoming light from the outgoing light using the beam splitter 30, which creates problems. For example, leakage of optical components is liable to make signal noises. Some of the light reflected at the beam splitter 30 can return to the optical waveguide layer 16, creating a signal noise. There is also a reliability problem: it has not been verified yet that the beam splitter 30 ensures the sufficiently stable properties against changes in ambient temperatures and aging.

To increase the coupling efficiency of the round-tip fiber 32, it is necessary to adjust the position with a high accuracy on the submicron order, which makes it difficult to fabricate the optical system. Particularly, in hermetically sealing the amplifier 14 in a package to fabricate a module, the round-tip fiber is soldered or bonded with an adhesive, which often causes misalignment during work, resulting in a poor fabrication yield.

As noted above, in conventional semiconductor laser amplifiers, the length of elements (cavity length) is large, leading to a poor productivity.

Some semiconductor laser amplifiers are available which have an improved productivity, but the incoming light and outgoing light are still propagated along the same optical fiber, which involves many factors creating signal noises. Use of insufficiently stable parts in terms of a change in ambient temperature and aging impairs the reliability. In addition, use of a round-tip fiber necessitates submicron adjustment in fabricating the module, making the work difficult.

SUMMARY OF THE INVENTION

Accordingly, the object of the present invention is to provide a highly reliable semiconductor laser amplifier with a high productivity.

In this invention, an optical waveguide layer, which is formed in a semiconductor substrate of a first conductivity type and contains a semiconductor layer of a second conductivity type, is arranged so as to form a V in a plane, which virtually makes the length of the optical waveguide layer twice the cavity length and differs the light incoming path from the light outgoing path.

With this semiconductor laser amplifier, since the length of the optical waveguide layer is virtually twice the cavity length, it is possible to shorten the cavity length without reducing the gain. Consequently, the number of laser amplifiers per wafer increases, improving the productivity of laser amplifiers.

Difference of the light incoming path from the light outgoing path decreases factors of creating signal noises such as light reflection, which improves the performance of the laser amplifier. Further, constructing the laser amplifier only with parts whose stability has been fully verified improves the reliability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a perspective view illustrating a semiconductor laser amplifier of the present invention built in a package;

FIG. 7 is a sectional view taken along line 6—6;

DETAILED DESCRIPTION OF THE PREFERRED EMBODIMENTS

Figure 1:
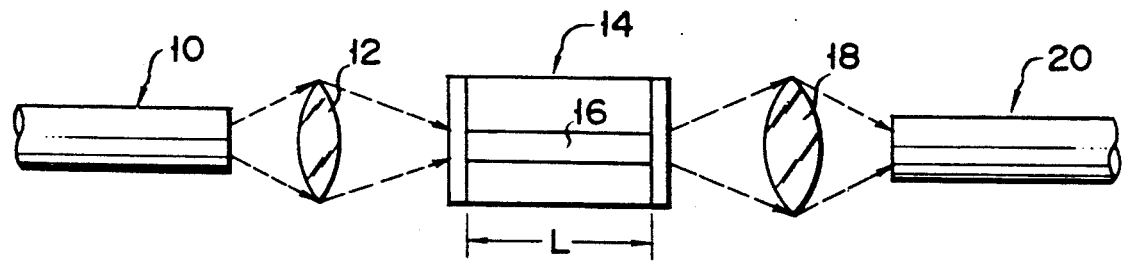
FIG. 1 is a schematic diagram of a conventional laser amplifier system.

Referring to the accompanying drawings, embodiments of the present invention will be explained. Like parts are shown by corresponding reference characters throughout several views, and redundant explanations will be avoided.

Figure 3:
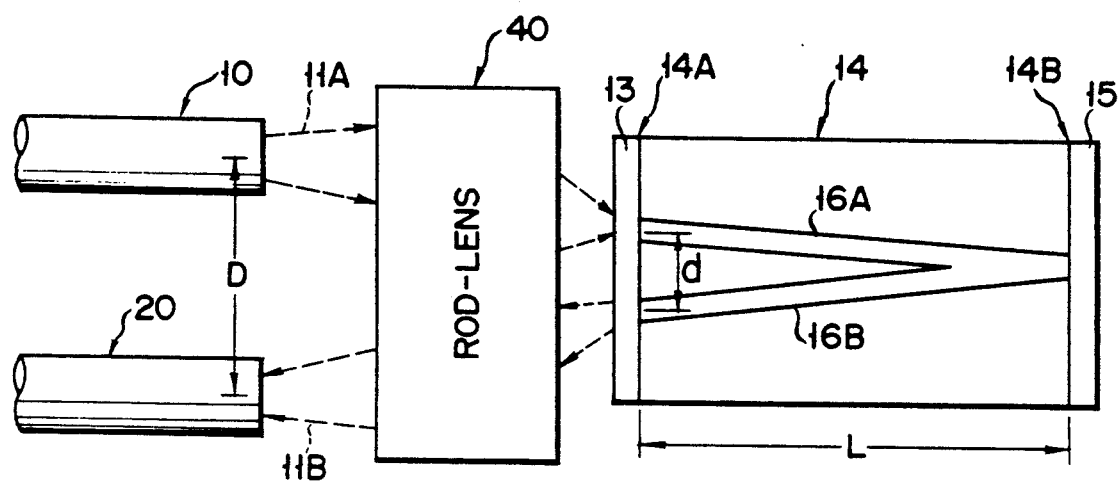
FIG. 3 is a schematic diagram for a semiconductor laser amplifier system according to a first embodiment of the present invention.

FIG. 3 is a schematic diagram of a semiconductor laser amplifier system according to a first embodiment of the present invention.

As shown in FIG. 3, the light 11A propagated along an optical fiber 10 passes through a rod lens 40 and enters an optical waveguide layer 16A at its incident end 14A of a laser amplifier 14. On the incident end 14A, for example, an anti-reflective film (AR film) 13 is placed. The light 11A goes into the optical waveguide layer 16A via the anti-reflective film 13. The optical waveguide layer 16A also serves as an optical active layer, in which the incident light is amplified. A high reflection coating film (HR film) 15 is placed on the reflective end 14B of the laser amplifier 14. The light traveling along the optical waveguide layer 16A increasing its gain is reflected at the high reflection coating film 15 and advances toward the optical waveguide layer 16B. To reflect light, a cleavage surface may be used as the reflective end 14B instead of the high reflection film 15. The optical waveguide layer 16B also serves as an optical active layer that amplifies light as does the optical waveguide layer 16A. The light traveling along the optical waveguide layer 16B increasing its gain reaches the incident end 14A and leaves the laser amplifier 14 to the outside via the anti-reflective film 13. This outgoing light 11B enters the optical fiber 20 via the rod lens 40. Use of the rod lens 40 makes it possible to spatially differ the incoming light from the outgoing light, along the paths from the optical waveguide layers 16A and 16B spaced a distance d of the order of several tens of μm apart to the optical fibers 10 and 20 spaced a distance D of the order of several hundreds of μm to several mm apart. For this reason, unlike a conventional method in which fiber strands must be directly soldered or bonded to the base with an adhesive, fibers may be inserted into the ferrule and bonded there with an adhesive, and then the ferrule is secured to the base using laser welding. This method provides a highly mechanically stable optical system. Only one rod lens 40 is required. With a single rod lens, simple adjustment of the incident angle of light entering or leaving the fibers 10 and 20 makes it possible to adjust both the focal point of light advancing from the optical fiber 10 to the laser amplifier 14 and the focal point of light advancing from the amplifier 14 to the fiber 20.

Figure 4:
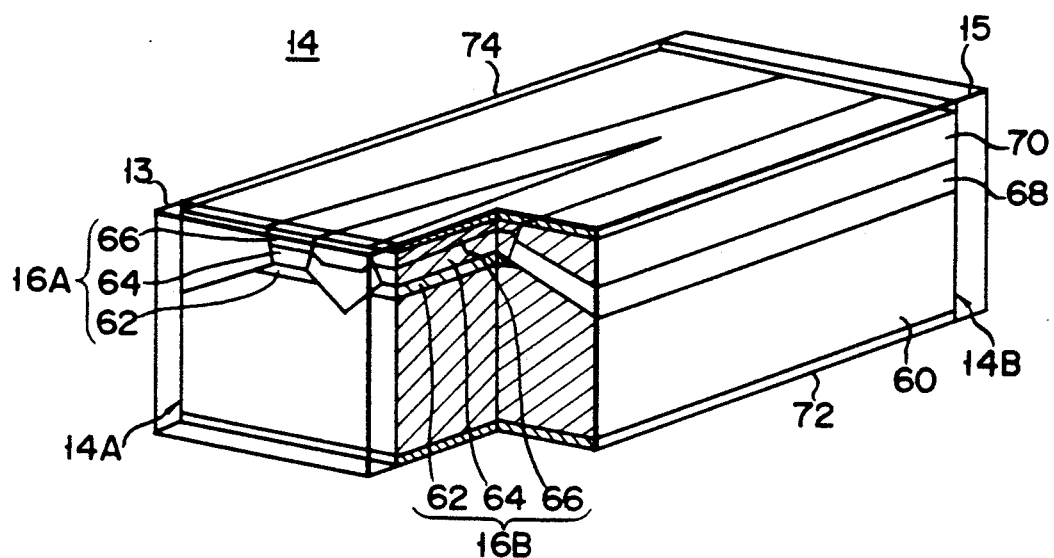
FIG. 4 is a perspective view, partially in cross-section, of a semiconductor laser amplifier according to the present invention.

FIG. 4 is a perspective view, partially in cross-section, of a semiconductor laser amplifier according to the present invention. The semiconductor laser amplifier is, for example, of the same type as that of the amplifier 14 in the system of FIG. 3. In this embodiment, an InGaAsP-based buried hetero semiconductor laser will be explained as an example.

As shown in FIG. 4, on an n-type InP substrate 60, the optical waveguide layers 16A and 16B are formed which are composed of an active layer 62, a p-type InP cladding layer 64, and a p-type InGaAsP ohmic contact layer 66. The optical waveguide layers 16A and 16B are arranged so as to form a V when viewed from the top. On either side of the active layer 62, p-type InP cladding layer 64, and p-type InGaAsP ohmic contact layer 66, a p-type InP buried layer 68, and an n-type InP buried layer 70 are formed to block current and light. Electrodes 72 and 74 are formed on the top and bottom surfaces of the laser amplifier 14, respectively. With supply of current from these electrodes 72 and 74, the optical waveguide layers 16A and 16B provide an optical amplification gain. On the incident end 14A of the laser amplifier 14, an anti-reflective film 13 is formed, while on its reflective end, a high reflection coating film 15 is formed. The reflectivity of the anti-reflective film 13 is set to a value on the order of $10^{-3}$ or less at the end of the optical waveguide layers 16A and 16B, whereas the reflectivity of the high reflection coating film 15 is set to a value in the range of 0.3 to 1.0. Adjusting the product of these reflectivities to the order of $10^{-4}$ or less suppresses laser oscillation, which allows the laser amplifier 14 to function as the progressive-wave type.

Figure 5:
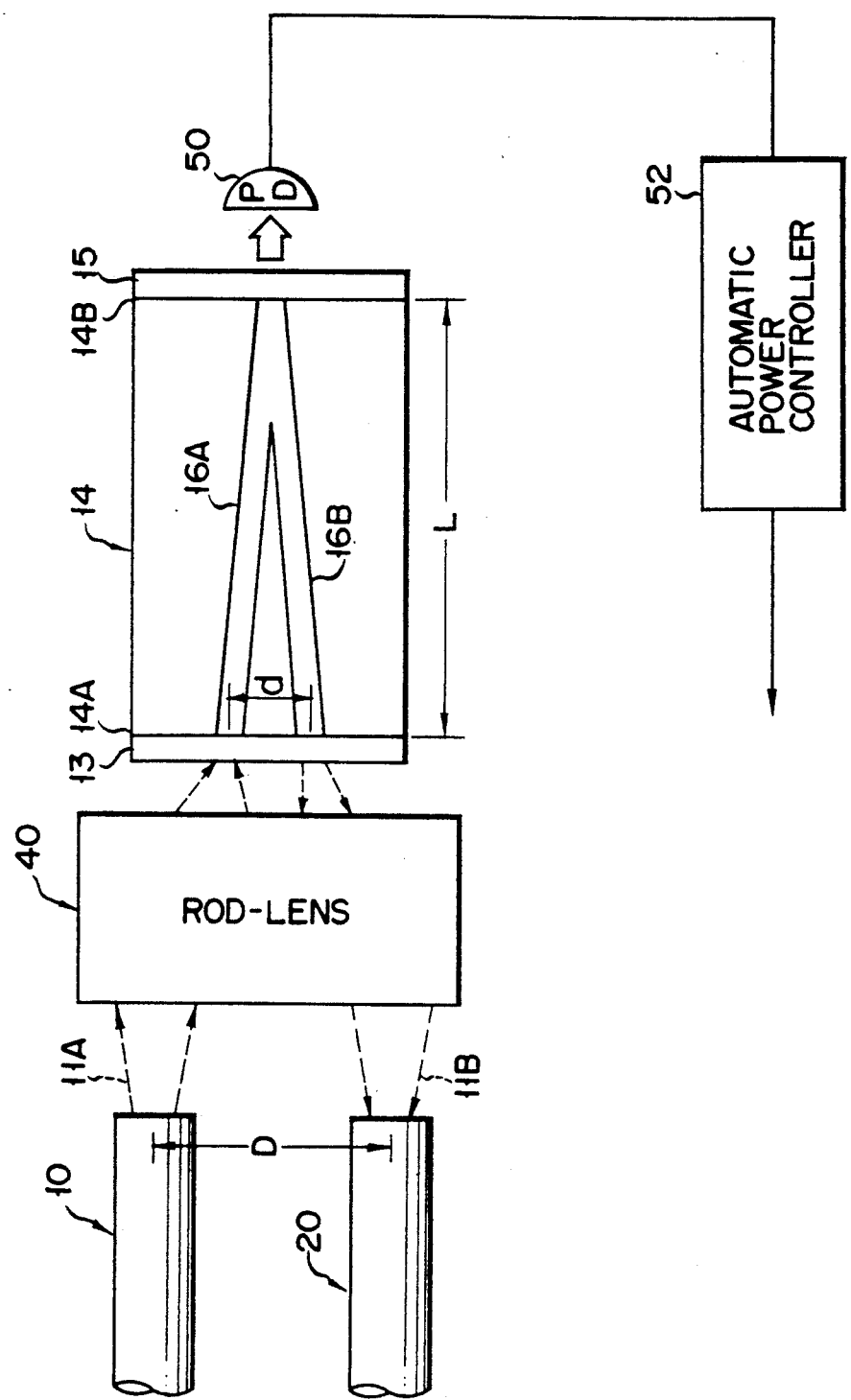
FIG. 5 is a schematic diagram of a semiconductor laser amplifier system according to a second embodiment of the present invention.

FIG. 5 is a schematic diagram of a semiconductor laser amplifier system according to a second embodiment of the present invention.

When the reflectivity of the high reflection coating film 15 is less than 1.0, self-adjustment of optical amplification is possible by as shown in FIG. 5, installing a light-receiving element for automatic gain adjustment, such as a photodiode 50, on the side of the reflective end 14B, and supplying the light-caused current at the photodiode 50 to an automatic power controller 52, which controls current supply to the laser amplifier 14.

Semiconductor laser amplifiers of the above-mentioned structure are manufactured in almost the same way as the manufacturing method of ordinary buried hetero laser elements. For example, on the n-type InP substrate 60, the active layer 62, p-type InP cladding layer 64, and p-type InGaAsP ohmic contact layer 66 are formed sequentially. Then, these layers are selectively etched by, for example, photoetching so as to form the optical waveguide layers 16A and 16B that take the form of an inverse-mesa stripe extending as far as below the active layer 62, and when viewed from the top, shape like a V. After this, the p-type InP buried layer 68 and n-type InP buried layer 70 are grown in sequence along the sides of the mesa stripe to form the laser amplifier 14. Next, a metal coating to form electrodes 72 and 74 and others is evaporated over the top and bottom surfaces of the laser amplifier 14. After this, the wafer is cloven into individual laser amplifiers 14. After cleavage, on both ends 14A and 14B of a laser amplifier 14, the anti-reflective film 13 and high reflection coating film 15 and others are formed as required.

FIG. 6 is a perspective view illustrating a laser amplifier 14 of this invention built in a package. FIG. 7 is a sectional view taken along line 6—6 of FIG. 6.

As shown in FIGS. 6 and 7, the laser amplifier 14 is secured onto a heat sink (bed) 60 with, for example, eutectic solder via a submount 59 such as diamond or silicon. The rod lens 40 is inserted in an opening 65 made in the cap-like lens holder 62 and then anchored in place with an adhesive member 64 such as solder or silver solder or glass sealer. This lens holder 62 is fastened to a stem 68 by, for example, welding 66, to hermetically seal the laser amplifier 14. As shown in FIG. 7, the heat sink 60 is connected to a low-potential power supply GND and the optical waveguide layers 16A and 16B of the chip 14 are connected to a high-potential power supply $V_{cc}$, which provides an operating potential for the laser amplifier 14.

With this package, optical coupling of the laser amplifier 14 and optical fibers 10 and 20 may be adjusted by fine adjustment of the positions of the optical fibers 10 and 20. That is, optical coupling adjustment of the optical fibers 10 and 20 and the laser amplifier 14 can be made independently of hermetic sealing of the laser amplifier 14, which increases the fabrication productivity of packages.

Figure 8:
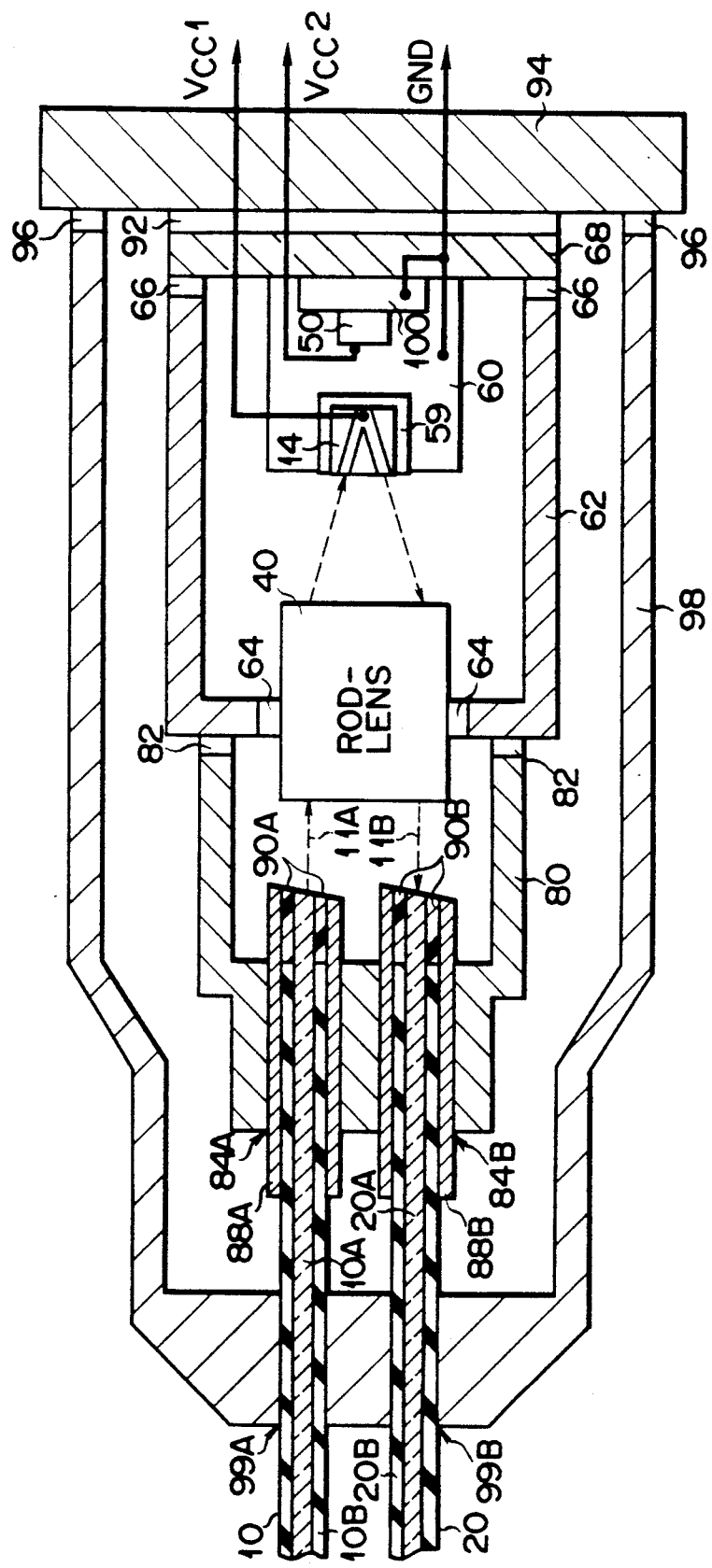
FIG. 8 is a sectional view illustrating a laser amplifier of this invention incorporated in a module.
Figure 9:
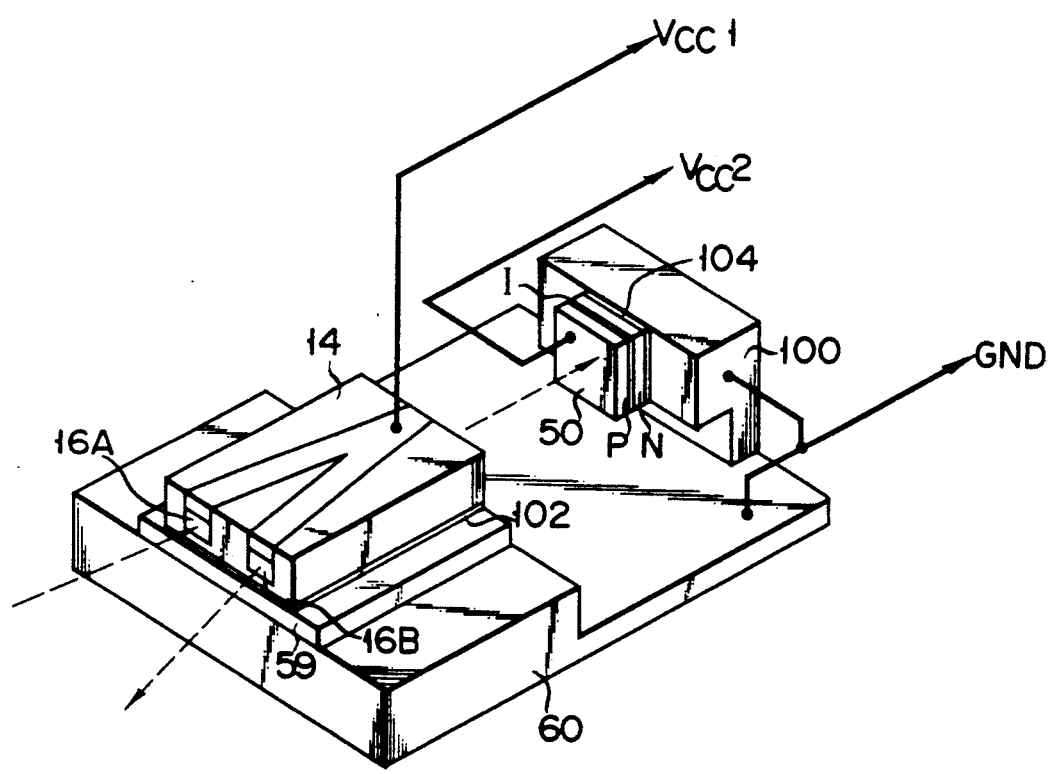
FIG. 9 is a perspective view enlarging the heat sink and its vicinity in FIG. 8.

FIG. 8 is a sectional view illustrating a laser amplifier 14 of the present invention incorporated in a module. FIG. 9 is a perspective view enlarging the heat sink 60 and its vicinity.

As shown in FIG. 8, an optical fiber holder 80 is fixed onto the lens holder 62 by welding or with an adhesive member 82 such as solder. In the optical fiber holder 80, a portion facing the rod lens 40 has an opening 84 made in it. Inserted in the opening 84 is a ferrule 86, which has two openings 88A and 88B. The optical fibers 10 and 20 are inserted in the openings 88A and 88B, respectively. At the ends of the optical fibers 10 and 20 on the side of the lens 40, fiber strands 10A and 20A extend beyond covering materials 10B and 20B. The fiber strands 10A and 20A are fastened in the ferrules 86A and 86B with epoxy resin 90A and 90B. The stem 68 on which the heat sink 60 is installed is anchored to an additional stem 94 by welding or with an adhesive member 92 such as solder. Onto the stem 94, a cap 98 is secured by welding or with an adhesive member 96 such as solder. The cap 98 covers the lens holder 62 and optical fiber holder 80. In the cap 98, a portion facing the optical fiber holder 80 has two openings 99A and 99B made in it. The optical fibers 10 and 20 pass through the openings 99A and 99B, respectively, and appear outside the cap 98.

Figure 10:
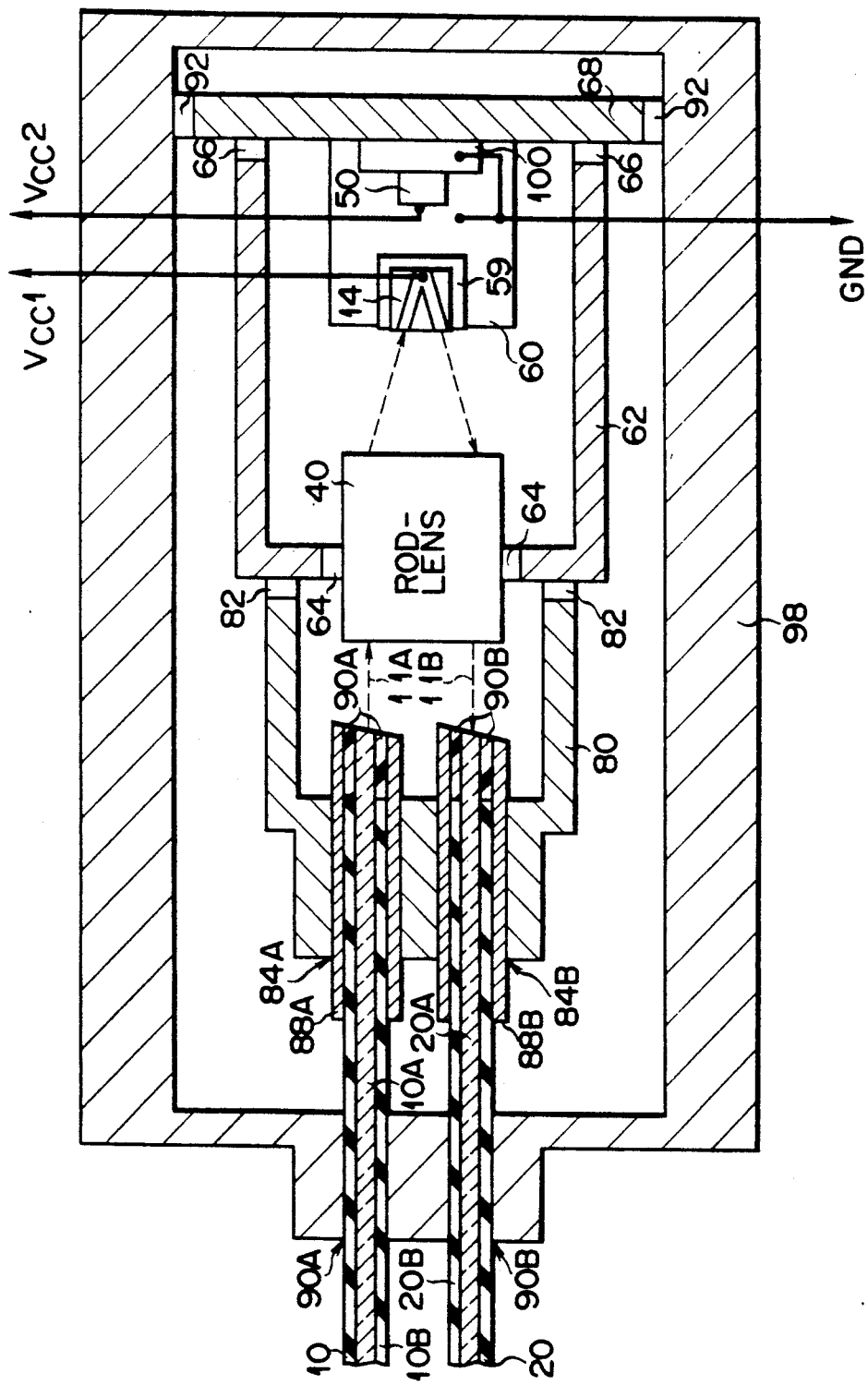
FIG. 10 is a sectional view illustrating a laser amplifier of this invention incorporated in a another module.

In the module, as shown in FIG. 9, on the heat sink 60, another heat sink (bed) 100 is provided. The laser amplifier 14 of the present invention is secured onto the heat sink 60 with, for example, eutectic solder 102 via the submount 59. On the additional heat sink 100, a P-I-N photodiode (light-receiving element) 50 is fixed with, for example, eutectic solder 104. This photodiode 50 has the same function as that of FIG. 5. The heat sinks 60 and 100 are connected to a low-potential power supply GND. The optical waveguide layers 16A and 16B of the chip 14 are connected to a high-potential power supply $V_{cc1}$, and the anode of the photodiode 50 (p-type semiconductor layer) is connected to a high-potential power supply $V_{cc2}$, which provides operating potentials for the laser amplifier 14 and photodiode 50. Further, as shown in FIG. 10, by building the module of FIG. 9 in a rectangular package such as a dual-in-line (DIL) package or a butterfly package, it is possible to facilitate circuit board mounting.

As described so far, with the semiconductor laser amplifier according to the present invention, the optical waveguide layers 16A and 16B amplifying light have a structure in which light is reflected at one of the two ends of the resonator, thereby achieving a sufficient amplification gain with a short cavity length L. This makes the size of the laser amplifier 14 smaller, improving the productivity of laser amplifiers 14. Since both receiving and transmitting of light is done at the remaining end of the laser amplifier 14, there is no need to develop a special package at all, and packages similar to conventional ones for semiconductor lasers may be used. Further, optical coupling adjustment can be made at only one place, facilitating optical coupling adjustment compared with conventional equivalents as shown in FIG. 1 where lenses are placed on both sides of the resonator.

Figure 2:
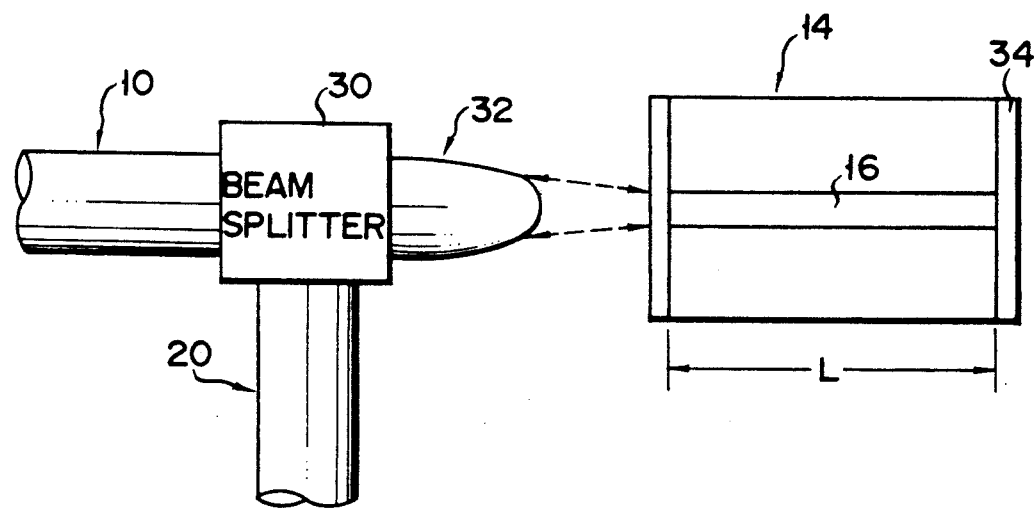
FIG. 2 is a schematic diagram of another conventional laser amplifier system.

The path along which light is applied to the laser amplifier 14 is different from the path along which light is emitted by the amplifier 14, which requires no beam splitter as shown in FIG. 2. This eliminates signal noise-causing factors. Furthermore, constructing the unit only with high-performance parts whose reliability has been fully verified provides a highly reliable semiconductor laser amplifier.

This invention may be practiced or embodied in still other ways without departing from the spirit or essential character thereof. For example, while in the embodiments, the semiconductor laser amplifier 14 is of the buried hetero type, it may be of the double-channel planar buried hetero type or the buried crescent type. In addition, the present invention may be applicable to the double hetero structure that has a transitional anti-melt-back layer between the active layer 17 and cladding layer 18, or to the distributed feedback laser that has a diffraction grating below the active layer 17.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor laser amplifier comprising:
   a semiconductor substrate of a first conductivity type having a major surface region, a first side face substantially perpendicular to said major surface region, and a second side face substantially perpendicular thereto;
   a first optical waveguide layer containing a semiconductor layer of a second conductivity type, and formed in said major surface region of said substrate so that one end of said first optical waveguide layer is in contact with said first side face of said substrate and the other end of said first optical waveguide layer is in contact with said second side face of said substrate;
   reflecting means formed on said second side face of said substrate, for reflecting light propagated along said first optical waveguide layer; and a second optical waveguide layer containing a semiconductor layer of a second conductivity type, and formed in said major surface region of said substrate so that one end of said second optical waveguide layer is in contact with said first side face of said substrate and the other end of said second optical waveguide layer is in contact with the other end of said first optical waveguide layer, wherein said first optical waveguide layer receives light from outside said substrate via said first side face and amplifies the light, and said second optical waveguide layer receives light reflected by said reflecting means, amplifies the reflected light, and emits the amplified light outward from said substrate via said first side face.

2. The semiconductor laser amplifier according to claim 1, wherein said reflecting means is a reflective film formed on said second end.

3. The semiconductor laser amplifier according to claim 1, wherein said reflecting means is a cleavage plane serving as said second end formed by cleaving said substrate.

4. The semiconductor laser amplifier according to claim 1, wherein the reflectivity R1 of said first end is:

$$R1 \leq 10^{-3}$$

the reflectivity R2 of said reflecting means formed on said second end is:

$$0.3 < R2 < 1.0$$

and the product of said reflectivities R1 and R2 is:

$$R1 \times R2 < 10^{-4}.$$

5. The semiconductor laser amplifier according to claim 1, further comprising an anti-reflective film formed on said first end.

6. A semiconductor laser amplifier module comprising:

a semiconductor laser amplifier including a semiconductor substrate of a first conductivity type having a first end and a second end, a first optical waveguide layer having a semiconductor layer of a second conductivity type formed in said substrate so that one end of the first waveguide layer may be in contact with said first end and the other end in contact with the second end, reflecting means on the second end of said substrate for reflecting the light propagated along said first optical waveguide layer, and a second optical waveguide layer having a semiconductor layer of the second conductivity type formed in said substrate so that one end of the second waveguide layer may be in contact with said first end and the other end in contact with the other end of said first optical waveguide layer;

a submount and a first bed on which said semiconductor laser amplifier is installed;

a first stem on which said first bed is installed;

a first holder that is installed to said stem and has a support at a portion facing the first end of said semiconductor laser amplifier;

a lens held in place by the support of said first holder;

a second holder that is installed to said first holder and has a support at a portion facing said lens; and first and second optical fibers held in place by the support of said second holder.

7. The semiconductor laser amplifier module according to claim 6, further comprising:

a second stem on which said first stem is installed;

a cap that is installed on said second stem and that covers said first and second holders; and first and second openings made in said cap, in which said first and second optical fibers are inserted, respectively.

8. The semiconductor laser amplifier module according to claim 6, further comprising:

a second bed formed at a portion of said first bed facing the second end of said semiconductor laser amplifier; and a photodiode installed on said second bed.

9. The semiconductor laser amplifier module according to claim 7, further comprising:

a second bed formed at a portion of said first bed facing the second end of said semiconductor laser amplifier; and a photodiode installed on said second bed.

10. The semiconductor laser amplifier module according to claim 6, wherein said lens is a rod lens.

11. The semiconductor laser amplifier module according to claim 7, wherein said lens is a rod lens.

12. The semiconductor laser amplifier module according to claim 8, wherein said lens is a rod lens.

13. A semiconductor laser amplifier module comprising:

a semiconductor laser amplifier including a semiconductor substrate of a first conductivity type having first and second ends, a first optical waveguide layer having a semiconductor layer of a second conductivity type and having a first end connected to the first end of the semiconductor substrate and a second end connected to the second end of the semiconductor substrate, a second optical waveguide layer having a semiconductor layer of the second conductivity type and having a first end connected to the first end of the semiconductor substrate and a second end connected to the second end of the semiconductor substrate and joined with the second end of the first optical waveguide layer, and reflecting means for reflecting light propagated along the first optical waveguide layer to the second optical waveguide layer;

first and second optical fibers each having ends facing the first end of the semiconductor substrate;

lens means, disposed between the ends of the first and second optical fibers and the first end of the semiconductor substrate, for directing light from the first optical fiber to the first optical waveguide layer and for directing light from the second optical waveguide layer to the second optical fiber;

first support means for supporting the lens means and the semiconductor laser amplifier in spaced relationship with each other; and second support means for supporting the ends of the first and second optical fibers and the lens means in spaced relationship with each other.

14. The semiconductor laser amplifier module of claim 13, further comprising means for housing the semiconductor laser amplifier, the lens means, and the first and second optical fibers.

* * * * *

UNITED STATES PATENT AND TRADEMARK OFFICE
CERTIFICATE OF CORRECTION

PATENT NO. : 5,229,879
DATED : July 20, 1993
INVENTOR(S) : Koichi Gen-ei

It is certified that error appears in the above-indentified patent and that said Letters Patent is hereby corrected as shown below:

Claim 4, column 7, line 25, change "$\leqq$" to --$\leq$--.

Claim 4, col. 7, line 30, change "<" (both occurrences) to --$\leq$--.

Claim 4, column 7, line 35, change "<" to --$\leq$--.

Signed and Sealed this

Fifth Day of July, 1994

Attest:

BRUCE LEHMAN

Attesting Officer

Commissioner of Patents and Trademarks